United States Patent [19]
Kozlov et al.

[11] Patent Number: 6,160,828
[45] Date of Patent: Dec. 12, 2000

[54] ORGANIC VERTICAL-CAVITY SURFACE-EMITTING LASER

[75] Inventors: Vladimir Kozlov, Plainsboro; Stephen R. Forrest; Paul Burrows, both of Princeton; Vladimir Bulovic, Metuchen, all of N.J.

[73] Assignee: The Trustees of Princeton University, Princeton, N.J.

[21] Appl. No.: 09/010,594

[22] Filed: Jan. 22, 1998

Related U.S. Application Data
[60] Provisional application No. 60/053,176, Jul. 18, 1997.

[51] Int. Cl.$^7$ ................................ H01S 3/16; H01S 3/05
[52] U.S. Cl. ................................ 372/39; 372/96; 372/99
[58] Field of Search .................................. 372/39, 45, 46, 372/96, 7, 50, 70, 99; 257/40; 428/690; 359/273; 313/503

[56] References Cited

U.S. PATENT DOCUMENTS

| | | | |
|---|---|---|---|
| 3,818,371 | 6/1974 | Herz et al. | 372/53 |
| 3,913,033 | 10/1975 | Tuccio et al. | 372/53 |
| 4,395,769 | 7/1983 | Damen et al. | 372/7 |
| 4,675,875 | 6/1987 | Takamiya | 372/45 |
| 5,212,706 | 5/1993 | Jain | 372/50 |
| 5,237,582 | 8/1993 | Moses | 372/53 |
| 5,307,363 | 4/1994 | Hosokawa et al. | 372/53 |
| 5,329,540 | 7/1994 | Lee et al. | 372/53 |
| 5,405,710 | 4/1995 | Dodabalapur et al. | 428/690 |
| 5,478,658 | 12/1995 | Dodabalapur et al. | 428/690 |
| 5,487,080 | 1/1996 | Mukherjee | 372/69 |
| 5,530,711 | 6/1996 | Scheps | 372/20 |
| 5,557,626 | 9/1996 | Grodzinski et al. | 372/45 |
| 5,559,400 | 9/1996 | Nakayama et al. | 313/506 |
| 5,578,379 | 11/1996 | Stutzmann et al. | 428/446 |
| 5,674,636 | 10/1997 | Dodabalapur et al. | 428/690 |
| 5,682,402 | 10/1997 | Nakayama et al. | 372/99 |
| 5,701,323 | 12/1997 | Kahr et al. | 372/54 |
| 5,739,545 | 4/1998 | Guha et al. | 257/40 |
| 5,881,089 | 3/1999 | Berggren et al. | 372/96 |

OTHER PUBLICATIONS

Schwartz et al, "Conjugated Polymers as Thin Film Solid–State Materials; Photopumped Lasing, Gain–Narrowing and Waveguiding", Materials Research Society 1997 Spring Meeting Abstract H1.1, Mar. 31, 1997.

Berggren et al, "Organic Light Emitting Microstructures", Materials Research Society 1997 Spring Meeting, Abstract H1.6, Mar. 31, 1997.

Zenz et al, "Laser Action in a Poly(Paraphenylene)–Type Ladder Polymer", Materials Research Society 1997 Spring Meeting, Abstract H2.1, Mar. 31, 1997.

McGehee et al, "Distributed Feedback Lasers Made with Semiconductor Conjugated Polymers as the Gain Material", Materials Research Society 1997 Spring Meeting, Abstract H2.2, Mar. 31, 1997.

Spiegelberg et al, "Gain Dynamics in Conjugated Polymers", Materials Research Society 1997 Spring Meeting, Abstract H2.3, Mar. 31, 1997.

Zang et al, "All–Optical Modulation in Crystaline Organic Semiconductor Waveguides", Appl. Phys. Lett. 60 (2) pp. 189–191, Jan. 13, 1992.

Tessler et al, "Lasing from Conjugated–polymer Microcavities", Nature 382, 695 (Aug. 22, 1996).

(List continued on next page.)

*Primary Examiner*—James W. Davie
*Attorney, Agent, or Firm*—Kenyon & Kenyon

[57] ABSTRACT

Organic vertical-cavity surface-emitting lasers ("OVCSELs"), in which a thin layer of organic material is disposed between highly reflective mirrors to thereby form a vertical cavity within a stacked arrangement. The lasers of the present invention each comprise a first mirror layer; a layer of active organic material over the first mirror layer; and a second mirror layer over the layer of first active organic material. The active organic material lases when pumped to thereby produce laser light. The present invention provides for optical semiconductor lasers with desired properties such as narrow bandwidth emission, the minimal use of active organic materials, and the facilitation of wavelength tuning and electrical pumping.

36 Claims, 12 Drawing Sheets

OTHER PUBLICATIONS

Hide et al, "Semiconducting Polymers: A New Class of Solid–State Laser Materials", Science 273, 1833 (Sep. 27, 1996).

Hermes et al, "High–efficiency Pyrromethene Doped Solid–State Dye Lasers", Appl. Phys. Lett. 63, 877, (Aug. 16, 1993).

Weiss et al, "Measurement of Optical Gain at 670 nm in an Oxazine–doped Polyimide Planar Waveguide", Appl. Phys. Lett 69, 3653 (Dec. 9, 1996).

Kogelnik et al, "Stimulated Emission in a Periodic Structure", Appl. Phys. Lett 18, 152 (Feb. 15, 1971).

Canva et al "Perylene–and Pyrromethene–Doped Xerogel for a Pulsed Laser", Appl Opt 34, 428 (Jan. 20, 1995).

Rothberg et al, "Status of and Prospects for Organic Electroluminescence", J. Mater Res, 11:3174 (Dec. 1996).

Greengram et al, "Semiconductor Physics of Conjugated Polymers", Solid State Physics, 49:1. (1995) (no month available).

V.G. Kozlov et al., Conf. On Lasers and Electro–optics CLEO '97, CPD–18, Opt. Soc. (no month available).

S.R. Forrest et al., Phys. Rev. B49, 11309 (1994). (Apr. 15).

CBP

Alq$_3$

DCM

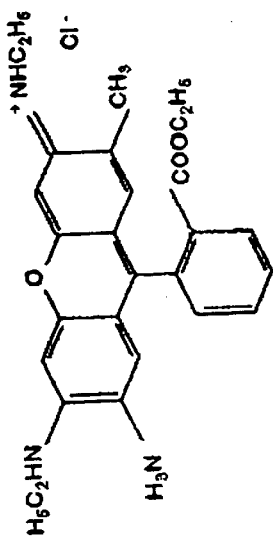
(Rhodamine 6G)
Fig. 3E
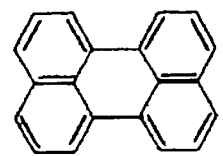
(Perylene)
Fig. 3G
(DCM2)
Fig. 3D
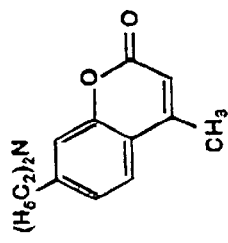
(Coumarin 47)
Fig. 3F

ORGANIC VERTICAL-CAVITY SURFACE-EMITTING LASER

RELATED APPLICATIONS

The present application claims the benefit, under 35 U.S.C. § 119(e) (2), of U.S. Provisional Application No. 60/053,176 filed on Jul. 18, 1997.

GOVERNMENT RIGHTS

This invention was made with Government support under Contract No. F49620-96-1-0277 awarded by AFOSR. The government has certain rights in this invention.

FIELD OF THE INVENTION

The present invention relates to the field of light emitting devices, in particular, to organic semiconductor lasers.

BACKGROUND INFORMATION

Several recent publications have reported phenomena such as superluminescence and amplified spontaneous emission in polymeric organic light emitters such as conjugated polymers. (N. Tessler et al., *Nature* 382, 695 (1996); F. Hide et al., *Science* 273, 1833 (1996), both of which are incorporated herein by reference). The materials used in those emitters were spin-coated from a solution of the polymer or its chemical precursors. Optically pumped, stimulated emission from organic laser dyes, introduced into inert, spin-coated polymers or gels has been described in the literature. (R. E. Hermes, et al., *Appl. Phys. Lett.* 63, 877 (1993); M. N. Weiss et al., *Appl. Phys. Lett.* 69, 3653 (1996); H. Kogelnik et al., *Appl. Phys. Lett.* 18, 152 (1971); M. Canva et al., *Appl. Opt.*, 34, 428 (1995), each of which is incorporated herein by reference).

When compared with other electrolumninescent materials, however, spun-on polymeric materials do not exhibit particularly good thickness uniformity, ability to achieve extremely high materials purity, operating lifetimes, and ease of integration with other conventional semiconductor fabrication processes. In the field of organic light emitting devices (OLEDs) for flat panel display applications, for example, small molecule OLEDs currently offer better operating lifetimes by an order of magnitude over their spin-coated, polymeric analogs. (L. J. Rothberg et al., "Status of and Prospects for Organic Electroluminescence", *J. Mater. Res.* 1996, 11:3174; N. C. Greenham et al., "Semiconductor Physics of Conjugated Polymers", *Solid State Physics* 1995, 49:1, both of which are incorporated herein by reference).

There is much recent interest in lasing action and stimulated emission in thin films of small molecular weight organic semiconductors and polymers as organic semiconductor lasers ("OSLs"). The low cost of organic materials and ability to grow them as quasi- and non-epitaxial thin films facilitates integration of OSLs with other optoelectronic devices, making them attractive for a number of applications. The particular optical and electronic properties of organic semiconductors result in OSL performance that is significantly more temperature stable than conventional inorganic laser diodes, a potential advantage in optical communications and sensor applications. For example, the lasing action in optically-pumped slab waveguide structures of vacuum-deposited thin films of small molecular weight organic semiconductors has been recently demonstrated. (See V. G. Kozlov et al., *Conf on Lasers and Electro-optics CLEO '97*, CPD-18, Opt. Soc. Am., Baltimore, Md., May 1997, incorporated herein by reference). The output power, differential quantum efficiency, and emission wavelength of these organic semiconductor lasers (OSLs) were found to be significantly more stable to changes in temperature than conventional inorganic laser diodes. This benefit of organic laser structures combined with the inherent advantages of organic semiconductors such as low cost, quasi- and non-epitaxial growth (S. R. Forrest et al., *Phys. Rev. B* 49, 11309 (1994), incorporated herein by reference), and ease of integration with other optoelectronic devices, provides strong motivation for further research. Presently, there is an interest in the development of OSL structures that result in desired OSL properties svch as narrow bandwidth emission, the minimal use of active organic materials, and the facilitation of wavelength tuning and electrical pumping.

SUMMARY OF THE INVENTION

The present invention provides organic vertical-cavity surface, emitting lasers ("OVCSELs"), in which a thin layer of organic material is disposed between highly reflective mirrors to thereby form a vertical cavity within a stacked arrangement. More specifically, the lasers of the present invention each comprise a first mirror layer; a layer of active organic material over the first mirror layer; and a second mirror layer over the layer of first active organic material. The active organic material lases when pumped to thereby produce laser light-that passes through one or both of the first and second mirror layers.

In one aspect, the present invention relates to optically-pumped OVCSELs. Embodiments of such OVCSELs include a source of optical pump energy for pumping the active organic material.

In another aspect, the present invention relates to electrically-pumped OVCSELs. In embodiments of such OVCSELs, the active organic material is electroluminescent and is disposed between a pair of electrodes. The active organic material is pumped when an electric current is passed between the electrodes.

BRIEF DESCRIPTION OF THE DRAWINGS

FIGS. 3A–3G show the chemical formulae for DCM, $Alq_3$ CBP, DCM2, Rhodamine 6G, Coumarin 47 and Perylene, respectively.

DETAILED DESCRIPTION

The present invention is directed to organic vertical-cavity surface-emitting lasers (OVCSELs). The present invention represents the first known successful demonstration of lasing action in a small molecular weight organic semiconductor microcavity structure associated with a clear threshold in the output power, a well-defined laser beam, cavity modes, and spectral line narrowing of emission above threshold to less than 1 Å. The high gain in these films is sufficient to generate lasing even in cavities with active regions less than 500 nm thick, thereby minimizing the amount of active organic material required for operation. The device of the present invention represents a significant advance toward realizing a new class of semiconductor laser diodes based on organic thin films.

The OVCSELs of the present invention are applicable to a wide variety of applications, including telecommunications, printing, optical downconversion, semiconductor circuit etching, thermal processing (e.g., marking, soldering and welding), spectroscopy, vehicular control and navigation, measurement devices, optical memory devices, displays, scanners, pointers, games and entertainment systems and sensors.

Figure 1:
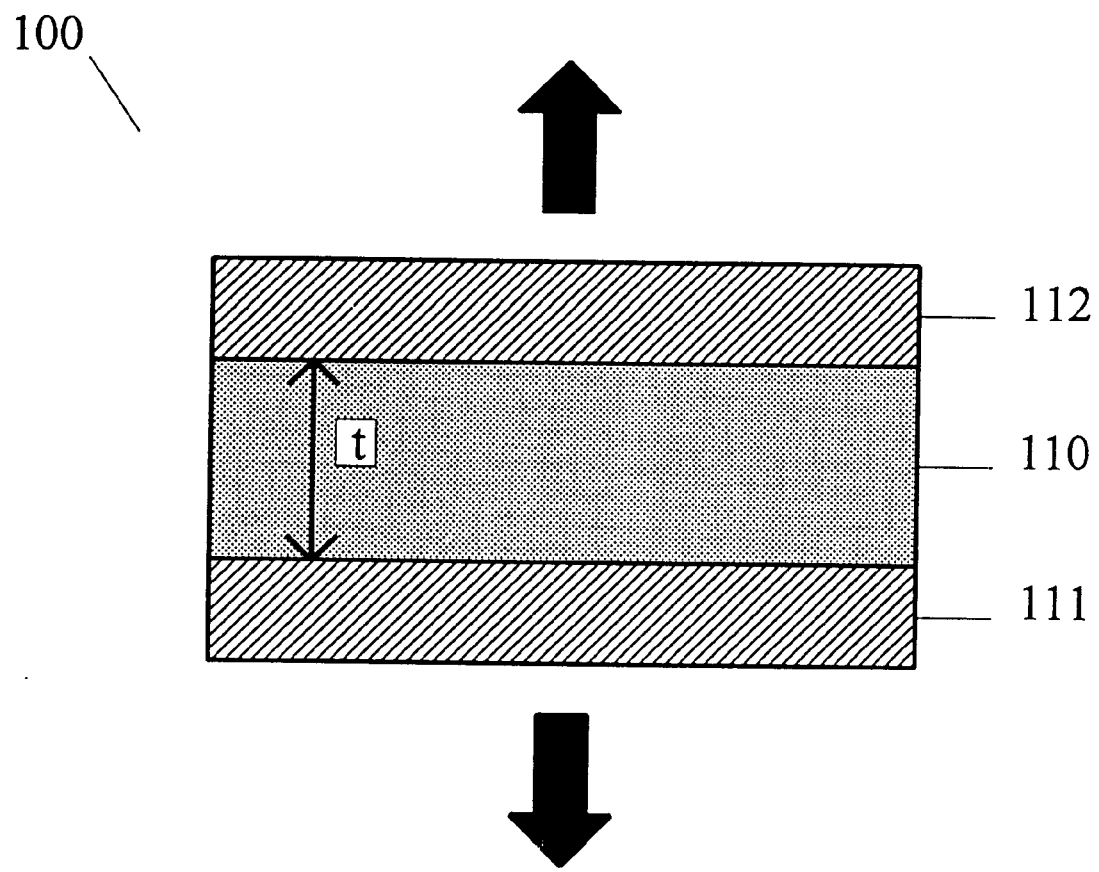
FIG. 1 shows a cross section of a laser cavity structure in accordance with an embodiment of the present invention.

FIG. 1 shows a cross section of a laser cavity structure 100 in accordance with an embodiment of the present invention. In this structure, an active organic material layer 110 is disposed between a first mirror layer 111 and a second mirror layer 112 to thereby form a cavity of thickness, t. The organic material in layer 110 is "active" in that it lases when pumped by optical or electrical means to thereby produce laser light. The first and second mirror layers 111, 112 each reflect a substantial amount of the light produced by the layer 110 so that only coherent laser light passes through layers 111, 112, the laser light having a desired wavelength and characterized by a narrow bandwidth. The first and second mirror layers 111, 112 each preferably reflect at least 90%, more preferably 95%, and most preferably 98%, of the light produced by the pumping of layer 110. If the first and second mirror layers 111, 112 reflect substantially the same percentage of light emitted from layer 110, the passage of light through both first and second mirror layers 111, 112 will be substantially equal, as shown in FIG. 1. If, for example, the second mirror layer 112 reflects a greater percentage of light than first mirror layer 111, however, then the passage of light will be primarily through the first mirror layer 111 provided that the absorption characteristics of the first and second mirror layers are equal.

Figure 2:
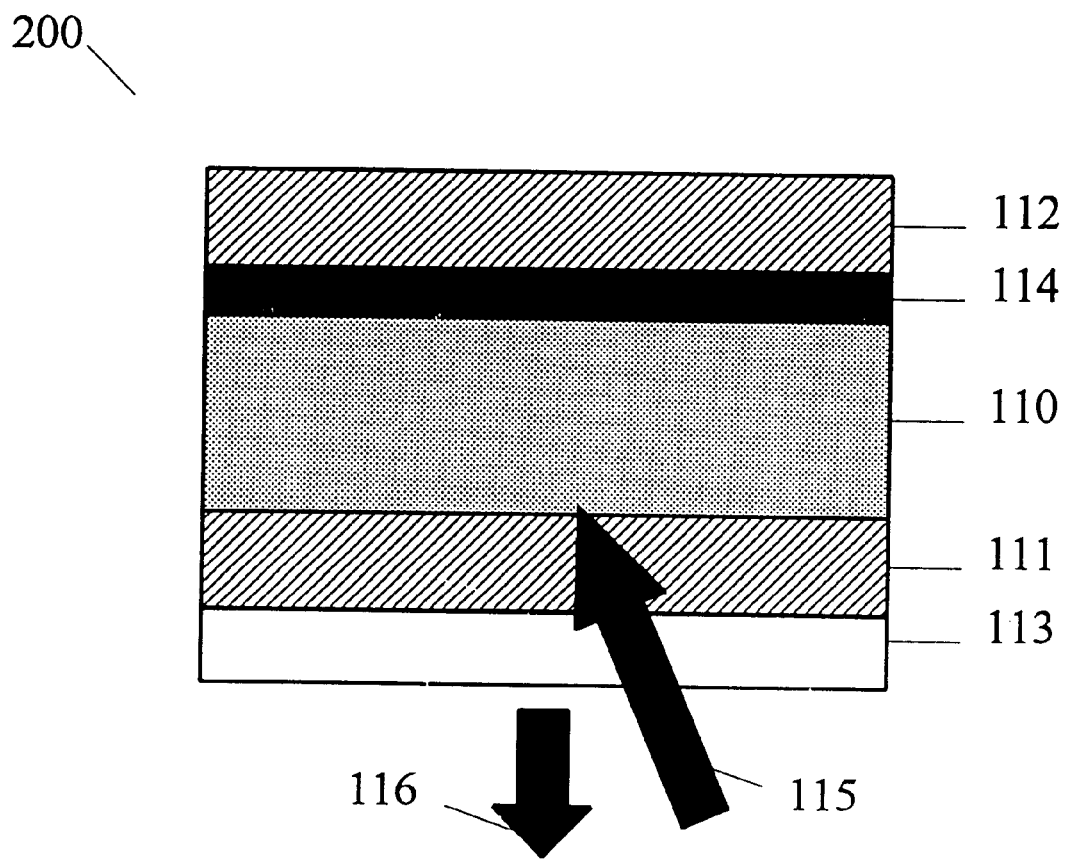
FIG. 2 shows a cross section of an optically-pumped laser, in accordance with an embodiment of the present invention.
Figure 3C:
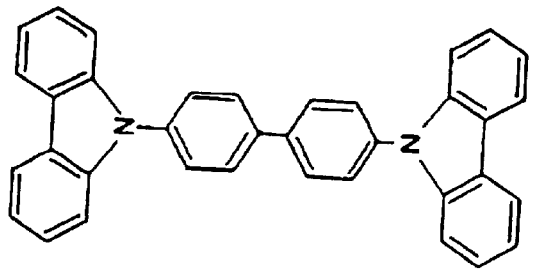
Figure 3B:
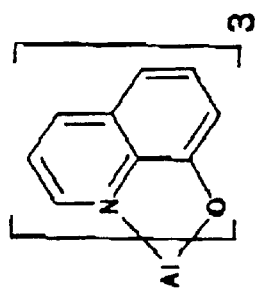
Figure 3A:
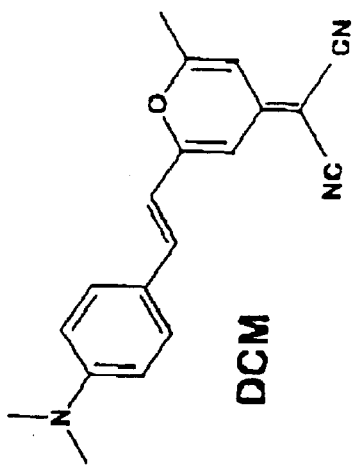

FIG. 2 shows an optically-pumped OVCSEL structure 200, in accordance with an embodiment of the present invention. A first mirror layer 111, a layer of active organic material 110 and a second mirror layer 112 are disposed on a substantially transparent substrate 113. The layer of active organic material 110 is pumped by incident optical pump energy 115. The source of optical pump energy (not shown) is any suitable source of intense light, such as a nitrogen laser.

The first and second mirror layers 111, 112, are any suitable reflective materials or structures. A preferred structure for the first mirror layer 111 is a distributed Bragg reflector ("DBR") dielectric mirror stack. DBR mirrors are commercially available and consist of $\lambda/4$ thick dielectric layers, where $\lambda$ represents the wavelength of the DBR mirror reflective stopband. DBR mirrors thus render the ability to control the OVCSEL output spectrum, which in turn narrows the linewidth of such output. DBR mirrors are typically characterized by reflectivities in excess of 99%. The second mirror 112 is preferably a DBR mirror or a layer of reflective metal or alloy such as silver, platinum, aluminum, magnesium-aluminum alloy, or combinations thereof. Metal mirrors typically have reflectivities in excess of 90%, but absorb more light than do DBR mirrors. When the second mirror 112 comprises a metal, the OVCSEL structure 200 preferably includes an organic buffer layer 114 to reduce quenching of the organic material in the layer 110 at the organic/metal interface with the layer 112. In the embodiment shown in FIG. 2, the combined reflectivity and absorption of the second mirror layer 112 is greater than that of the first mirror layer 111, thus resulting in laser emission 116 through the first mirror layer 111.

The substrate 113 is any suitable transparent substrate such as quartz, glass, sapphire or plastic. The substrate 113 is limited to those materials which are transparent to the wavelengths of incident optical pumping energy and of laser light produced by layer 110.

In all embodiments of the present invention, the active organic material in layer 110 comprises host and dopant molecules. The pump energy imparted to layer 110 is absorbed by the host molecule and is non-radiatively transferred by a dipole-dipole transition to the dopant molecule. For this to occur, the emission spectrum of the host must overlap with the absorption spectrum of the dopant. The resulting efficient "Förster" energy transfer requires only a low concentration of dopant molecules, which in turn reduces the lasing threshold, increases laser efficiency, and extends operational lifetime. The host materials used in the present invention are selected from any materials that provide good charge transport and are able to transfer energy to a dopant material via Förster energy transfer or carrier capture. In addition, the rate of energy transfer to the dopant must be faster than the non-radiative recombination in the host. The dopant materials used in the present invention are any highly efficient luminescent molecules having luminescence (lasing) emission in the same spectral range as the transparency region of the host:dopant system. Exemplary host-dopant systems for use as the active organic material in the present invention, and some of their associated lasing characteristics are set forth in Table I.

TABLE I

Exemplary active organic materials for use in the OVCSELs of the present invention.

| Host | Dopant | Lasing Wavelength (nm) | Lasing Threshold ($\mu J/cm^2$) | Operating Lifetime (# of pump laser pulses) |
|---|---|---|---|---|
| $Alq_3$ | DCM | 615–660 | 3 | >$10^6$ |
| $Alq_3$ | DCM2 | 655–700 | 2.5 | >$10^6$ |
| $Alq_3$ | Rhodamine 6G | 610–625 | 30 | $10^3$ |
| CBP | Perylene | 485 | 5 | >$10^5$ |

TABLE I-continued

Exemplary active organic materials for use in the
OVCSELs of the present invention.

| Host | Dopant | Lasing Wavelength (nm) | Lasing Threshold ($\mu J/cm^2$) | Operating Lifetime (# of pump laser pulses) |
|------|--------|------------------------|----------------------------------|---------------------------------------------|
| CBP  | Coumarin 47 | 460 | 15 | $10^3$ |
| CBP  | Coumarin 30 | 510 | 15 | — |

The formulae for the chemicals known as DCM (Exciton Inc. of Dayton, Ohio), $Alq_3$, CBP, DCM2 (Exciton Inc. of Dayton, Ohio), Rhodamine 6G, Coumarin 47 and Perylene are shown in FIGS. 3A–3G, respectively. The organic materials used in the present invention are deposited by any suitable technique, such as by vacuum thermal evaporation.

Figure 4:
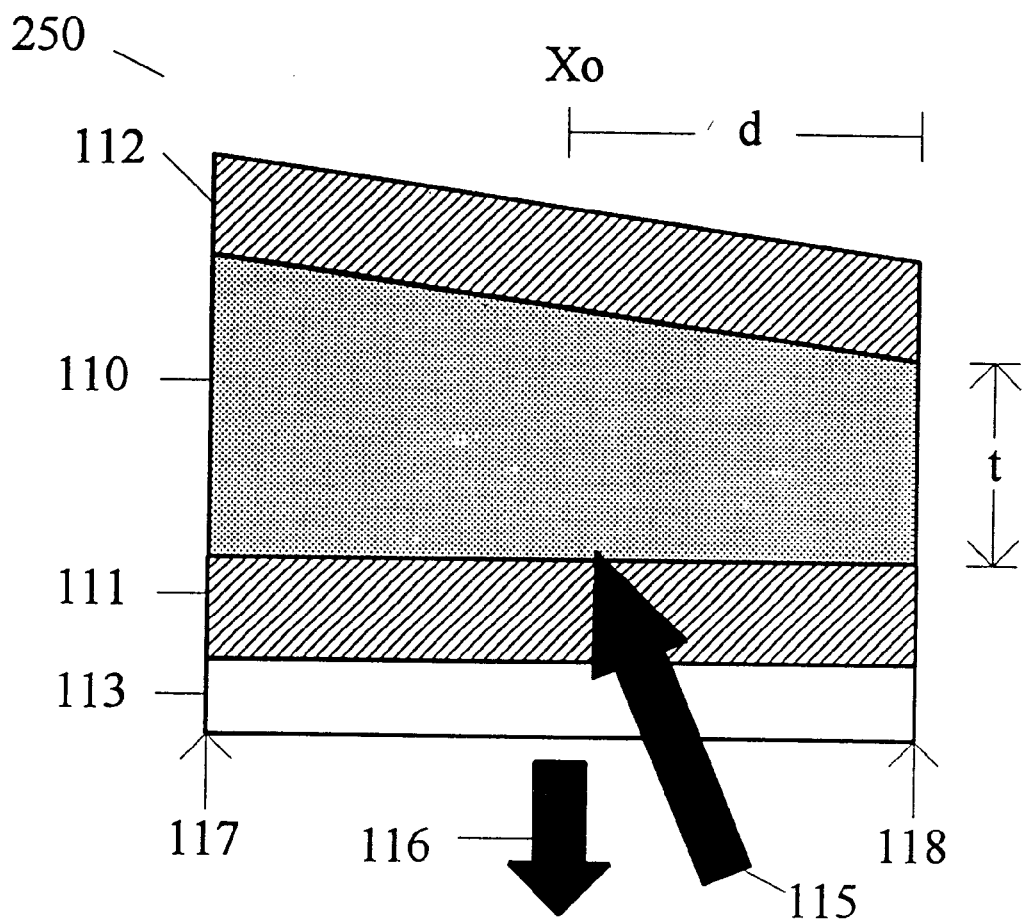
FIG. 4 shows a cross section of a tunable optically-pumped laser, in accordance with an embodiment of the present invention.

The present invention includes embodiments in which the laser emission is tunable to a specific wavelength. FIG. 4 shows an example of an optically-pumped, tunable OVCSEL 250 in accordance with an embodiment of the present invention. In this embodiment, the thickness, t, of the layer 110 of active organic material changes monotonically from the left edge 117 to the right edge 118 of the structure. By changing the thickness of the OVCSEL cavity, the emission wavelength is tunable by as much as 50 nm or more, due to the wide gain spectrum of the lasing material in layer 110. Such thickness variation is achieved, for example, by masking the substrate with a sliding shadow mask during growth of layer 110. The tunable OVCSEL is pumped by a pump beam 115, which excites the active organic material of layer 110 at a point Xo, which is at a distance d away from the right edge 118. The wavelength of laser emission 116 is a function of the cavity thickness t and the index of the organic material in layer 110. By changing the position of point Xo, a different section of the OVCSEL structure 250 (having a different thickness, t) is excited by pump beam 115, thus resulting in a different wavelength of emission 116. Changing the position of Xo by varying d is accomplished by, for example, moving the OVCSEL structure 250, moving the position or angle of the pump beam 115, or both. As an example, the inventors have changed the laser emission of an optically-pumped $Alq_3$:DCM laser of the present invention from 598 to 635 nm by changing the thickness of layer 110 from 430 to 500 nm.

Figure 5:
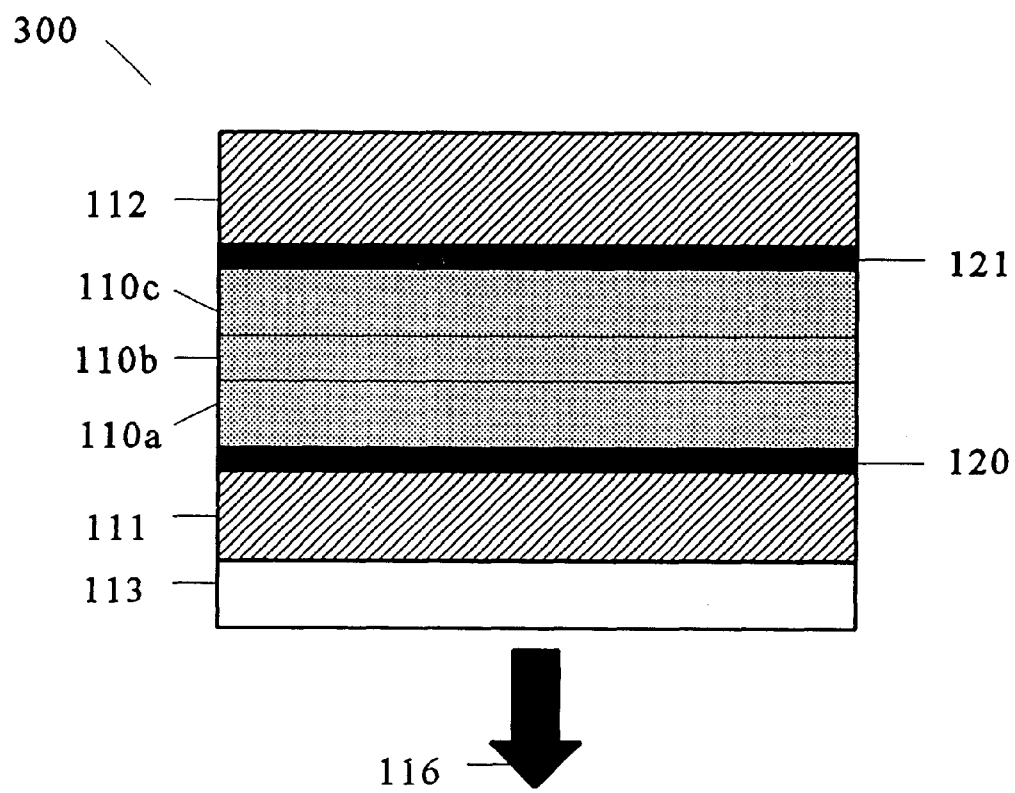
FIG. 5 shows a cross section of an electrically-pumped laser, in accordance with an embodiment of the present invention.

FIG. 5 shows an electrically-pumped OVCSEL structure 300, in accordance with an embodiment of the present invention. A first mirror layer 111, a layer of active organic material 110 and a second mirror layer 112 are disposed on a substantially transparent substrate 113. If the first and second mirror layers 111, 112 are not able to function as electrodes, or alternatively if it is preferable to have separate electrodes, a first electrode 120 is disposed between the first mirror layer 111 and the layer of active organic material 110, and a second electrode 121 is disposed between the layer of active organic material 110 and the second mirror layer 112. In this embodiment, the organic material in layer 110 is electroluminescent such that it is pumped to produce laser light when an electric current is passed therethrough. As is known in the art, the organic material in layer 110 typically consists of three sub-layers: a hole transporting layer ("HTL") 110a, an emissive layer ("EL") 110b, and an electron transporting layer ("ETL") 110c. First and second electrodes 120, 121 (in the embodiment shown in FIG. 5, first and second electrodes are anode and cathode, respectively) are substantially transparent to the light emitted by layer 110b, and preferably comprise indium-tin-oxide or any other transparent conducting material.

Figure 6:
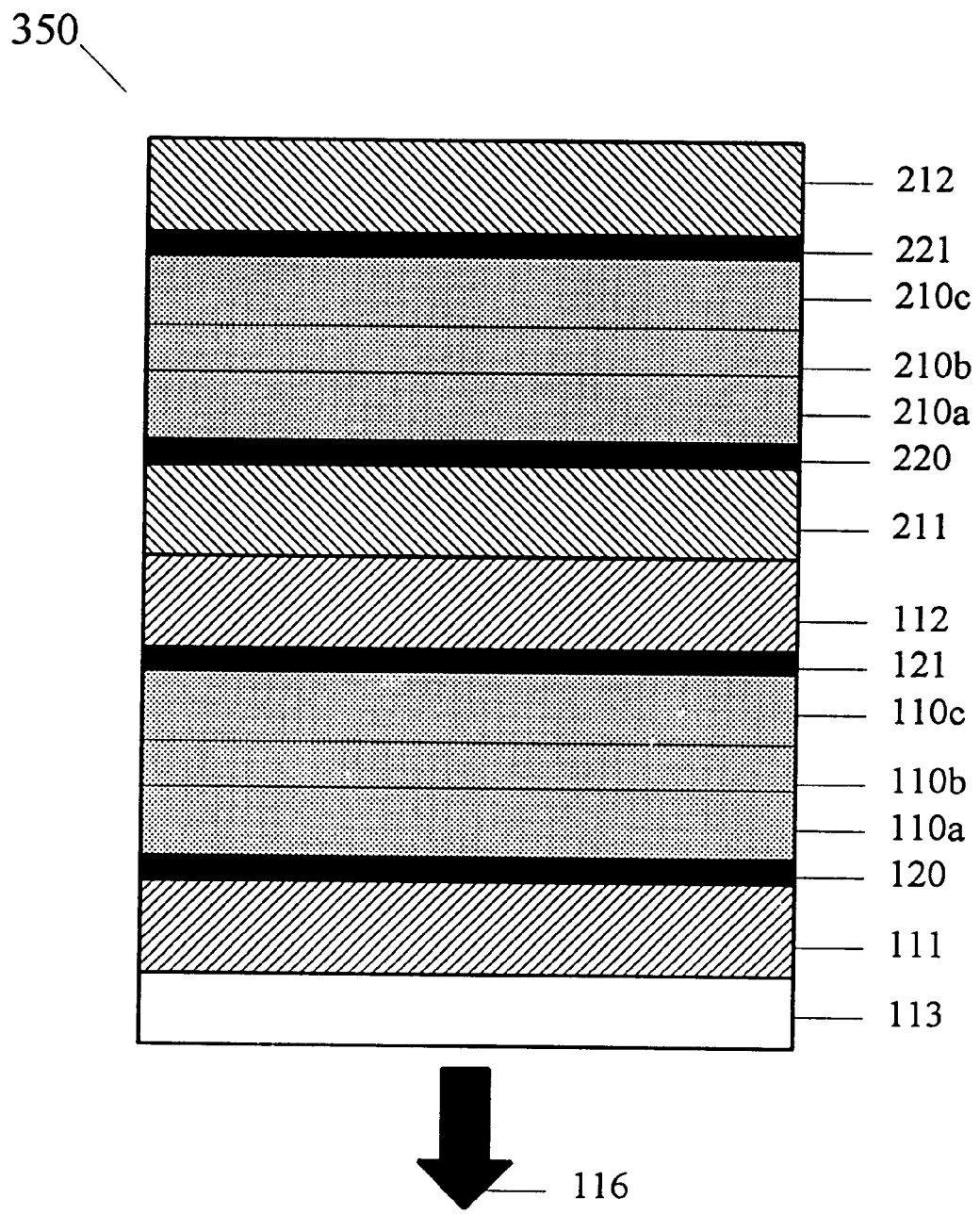
FIG. 6 shows a cross section of a stacked, multicolor electrically-pumped laser, in accordance with an embodiment of the present invention.

In one embodiment of the present invention, multiple electrically-pumped OVCSEL structures are placed in a stacked arrangement 350, as shown in FIG. 6, for the emission of laser light of various colors. The stacked arrangement 350 includes the structure 300 as shown in FIG. 5, but also includes a third mirror layer 211, a third electrode 220, sublayers 210a, 210b, and 210c (corresponding to HTL, EL and ETL layers, respectively) of a second active organic material, a fourth electrode 221, and a fourth mirror layer 212 as shown in FIG. 6. As in the OVCSEL structure 300, the electrodes 120, 121, 220 and 221 are only necessary in the stacked arrangement 350 if the respective mirror structures 111, 112, 211 and 212 cannot function as electrodes, or alternatively if it is preferable to have electrodes separate from the mirror structures. Although only two OVCSEL structures are shown in the stacked arrangement 350, the present invention includes embodiments in which three or more OVCSEL structures are stacked in a unitary structure. The stacking of OVCSEL structures facilitates the lasing of multiple colors, each from a respective OVCSEL, alone or in any combination.

Figure 7:
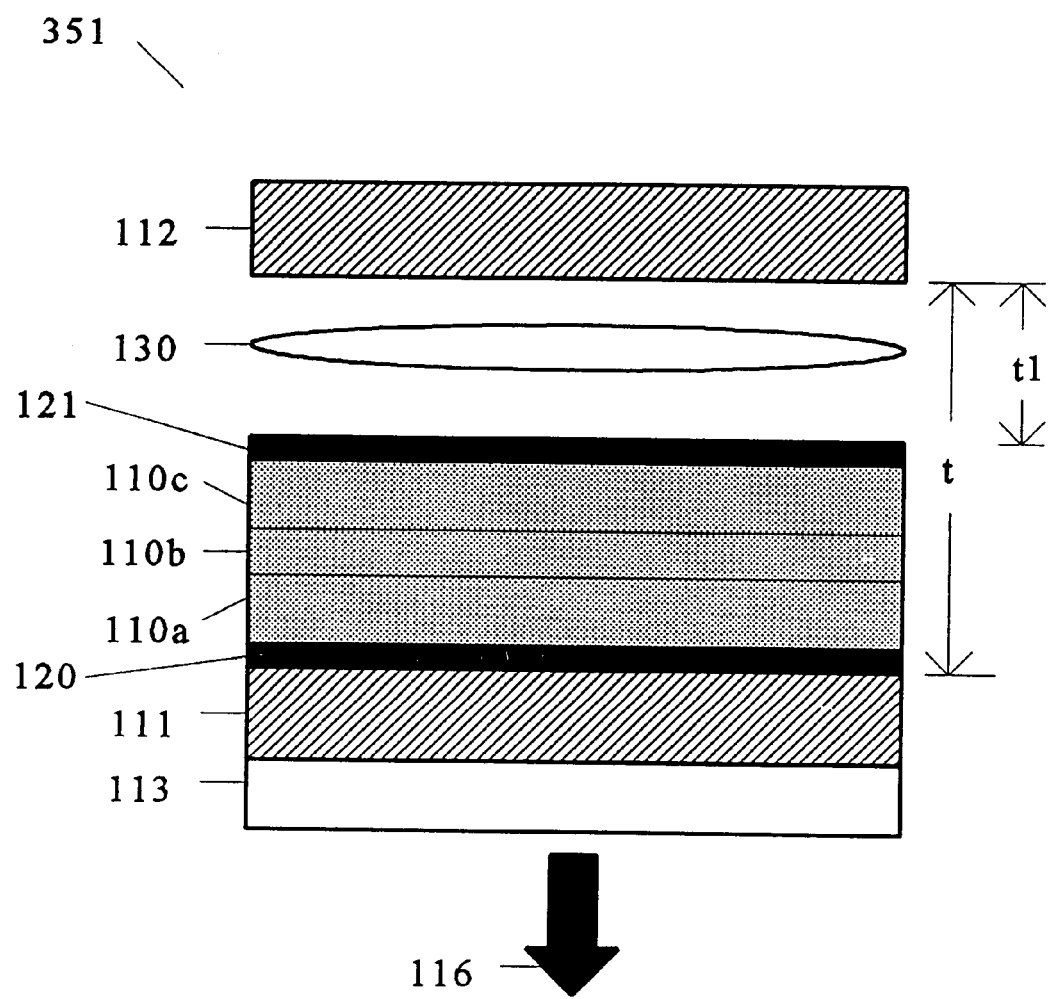
FIG. 7 shows a cross section of a tunable electrically-pumped laser, in accordance with an embodiment of the present invention.

The present invention includes electrically-pumped OVCSELs that are tunable to specific wavelengths. FIG. 7 shows an example of such a tunable OVCSEL 351 in accordance with an embodiment of the present invention. As described for the optically-pumped tunable OVCSEL 250, the laser emission wavelength of OVCSEL 351 is tunable by varying the thickness t of the OVCSEL cavity. The variation in t is accomplished by controlling the distance t1 between the second electrode 121 and the second mirror layer 112. The distance t1 is varied by the controlled movement of the second mirror layer 112 towards or away from the second electrode 121, or vice-versa. Optical lens 130 is disposed between the second electrode 121 and the second mirror layer 112 to permit the variation in t1 without losing control of the laser light emitted from layer 110b.

Figure 8:
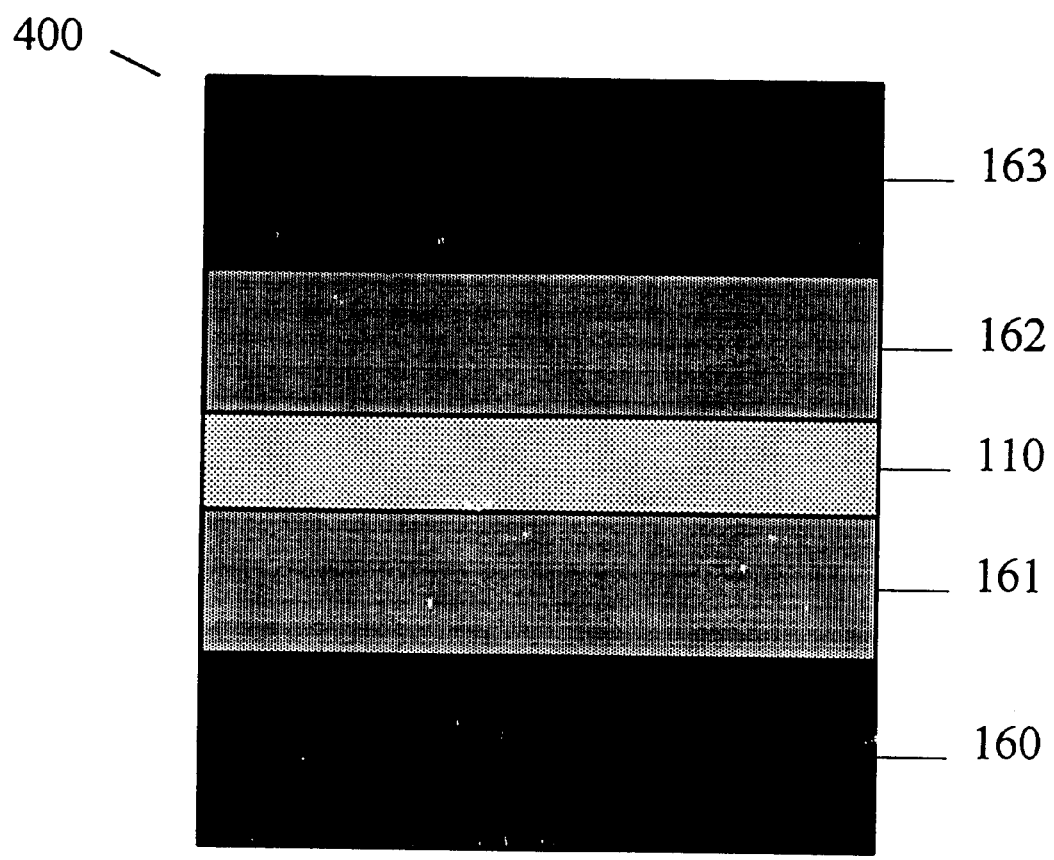
FIG. 8 shows a cross section of a waveguide reducing structure, in accordance with an embodiment of the present invention.

All embodiments of the present invention optionally include guiding and cladding layers around the organic layers to help minimize waveguiding losses in the organic layers. For example, waveguide optical losses in organic layers of thickness 150 nm are often as high as 1000 $cm^{-1}$ or more where metal electrodes are used in electroluminescent devices. A structure 400 as shown in FIG. 8 is used to minimize such losses. Structure 400 includes guiding layers 161 and 162 immediately adjacent to the organic layer(s) 110, and cladding layers 160 and 163 immediately adjacent to the guiding layers 161 and 162, respectively. As is known in the art and previously discussed, if layer 110 comprises an electroluminescent material, it may actually comprises multiple sublayers (i.e., HTL, EL and ETL layers). The guiding layers 161, 162 are highly transparent to minimize optical losses, and are characterized by a high refractive index. The cladding layers 160, 163 are also transparent but possess a lower refractive index than the guiding layers 161, 162. The cladding layers 160, 163 also generally have higher conductivities than the guiding layers 161, 162, as one of the primary purposes of cladding layers 160, 163 is to conduct electrical current. The structure 400 reduces the confinement of emitted light in organic layer(s) 110, thus reducing optical losses to as low as 10 $cm^{-1}$ or less. The structure 400 is optionally used with any of the optically- or electrically-pumped embodiments of the present invention. For example, when used with the optically-pumped embodiment 200 of the present invention, the structure 400 is substituted for the layer of active organic material 110 in FIG. 2. Likewise, when used with the electrically-pumped embodiment 300, the structure 400 is substituted for the sub-layers 110a, 110b and 110c such that the structure 400 is sandwiched by the electrodes 120 and 121. When used with the electrically-pumped embodiment, the guiding and cladding layers 160, 161, 162, 163 must be sufficiently conductive to provide charge carriers to the conductive layer(s) 110 from the electrodes 120, 121. It is preferred, however, that the conductivity of guiding layers 161, 162 is less than that of cladding layers 160, 163, which have a conductivity less than that of the surrounding electrodes 120, 121. The preferred material for the guiding and cladding layers 160, 161, 162, 163 is indium-tin-oxide, the refractive index, conductivity and transparency of which is varied, for example, by varying oxygen content.

The present invention is further described with reference to the following non-limiting example.

EXAMPLE

As one example of the embodiment shown in FIG. 2, an OVCSEL 200 was formed comprising an active layer 110 of tris-(8-hydroxyquinoline) aluminum ("Alq$_3$") doped with DCM laser dye. The thickness of the active layer 110 was 500 nm. The concentration of DCM laser dye in the layer 110 was 3% by weight. The active layer 110 was deposited onto the first mirror layer 111 (a DBR mirror in this example) by thermal evaporation at $5 \times 10^{-7}$ Torr. Buffer layer 114 comprised Alq$_3$ and was deposited over the active layer 110, and a silver mirror layer 112 was deposited over the buffer layer 114. The thicknesses of the buffer layer 114 and the DBR mirror layer 111 were 20 nm and 200 nm, respectively. The DBR mirror layer 111 had a >99% reflective stopband between 600 nm and 700 nm, while the reflectivity of the silver mirror was calculated to be 91%.

The OVCSEL 200 was optically pumped using a nitrogen laser ($\lambda$=337 nm), which generated 500 ps pulses at a 50 Hz repetition rate. The pump beam was aimed incident through the DBR mirror 111 and was focused to a spot approximately 100 $\mu$m across on the organic film surface. At the wavelength of the exciting laser (i.e., $\lambda$=337 nm) the DBR mirror 111 exhibited a transmittance of about 80%. In this example, the substrate 113 comprised quartz, which is transparent to a pump beam characterized by $\lambda$=337 nm.

The emission spectrum in the substrate normal direction (with a 15° full angle acceptance cone) was analyzed by a spectrograph using a charge-coupled device camera with a wavelength resolution of 1 Å. To avoid material degradation, all measurements were performed in a dry nitrogen environment.

Figure 9:
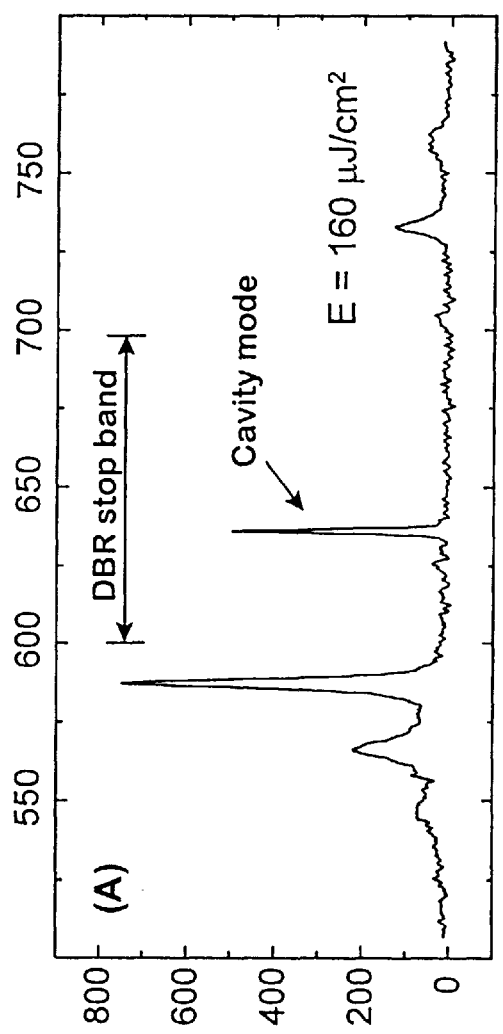
FIG. 9 shows the spontaneous emission spectrum in the substrate normal direction from an exemplary embodiment of an OVCSEL in accordance with the present invention.
Figure 10:
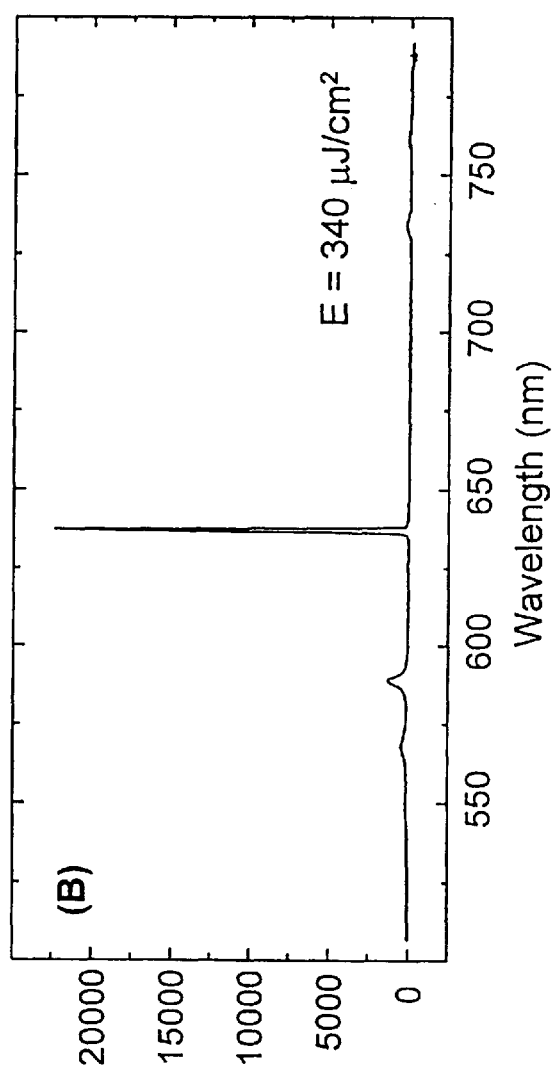
FIG. 10 shows the emission spectrum, at a high excitation level, from an exemplary embodiment of the OVCSEL of the present invention.

FIG. 9 shows the spontaneous emission spectrum of the OVCSEL 200 just below the lasing threshold. A cavity mode was observed at $\lambda$=635 nm. At $\lambda$<600 nm and $\lambda$>700 nm, the spontaneous emission is filtered by the modulation in the DBR transmission spectrum resulting in the broad satellite peaks observed. The spectrum above the lasing threshold, corresponding to an energy of $E_{TH}$=300 $\mu$J/cm$^2$, is completely dominated by the high gain, spectrally narrow laser emission, as shown in FIG. 10.

Figure 11:
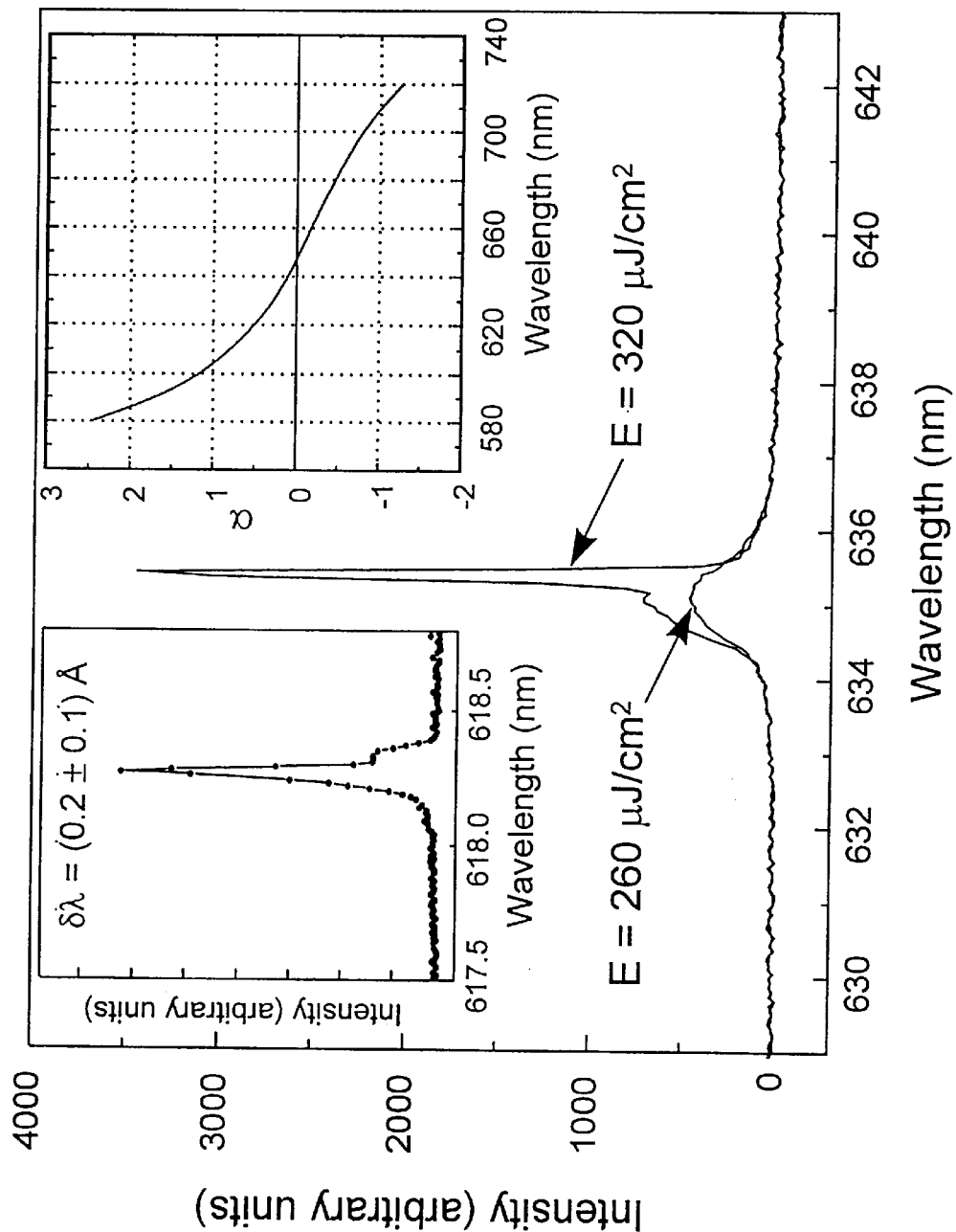
FIG. 11 shows a high resolution emission spectrum from an exemplary embodiment of the OVCSEL of the present invention as a function of excitation near the lasing threshold.

FIG. 11 shows the high resolution emission spectra from the OVCSEL 200 at increasing excitation levels near the lasing threshold. Pump energies and the spectral full width at half maximum are indicated. The transition from the 12 Å wide spontaneous emission peak, spectrally filtered by the microcavity below threshold, to the resolution-limited, <1 Å full width spectral line due to laser emission above threshold, is clearly observed. The spectral width of the peak below threshold is related to the finesse (the ratio of microcavity mode spacing to a single mode linewidth) of the microcavity, with additional broadening due to the presence of several transverse modes. Mode competition above threshold confines lasing to only a few of the transverse modes, leading to a concomitant reduction in the emission linewidth. The left inset of FIG. 11 shows (0.4±0.1)Å broad emission line of an OVCSEL with a cavity thickness of 475 nm. Accounting for the (0.2±0.1)Å instrument resolution, the Gaussian full-width-at-half-maximum of the lasing line is calculated to be (0.2±0.1)Å.

Figure 12:
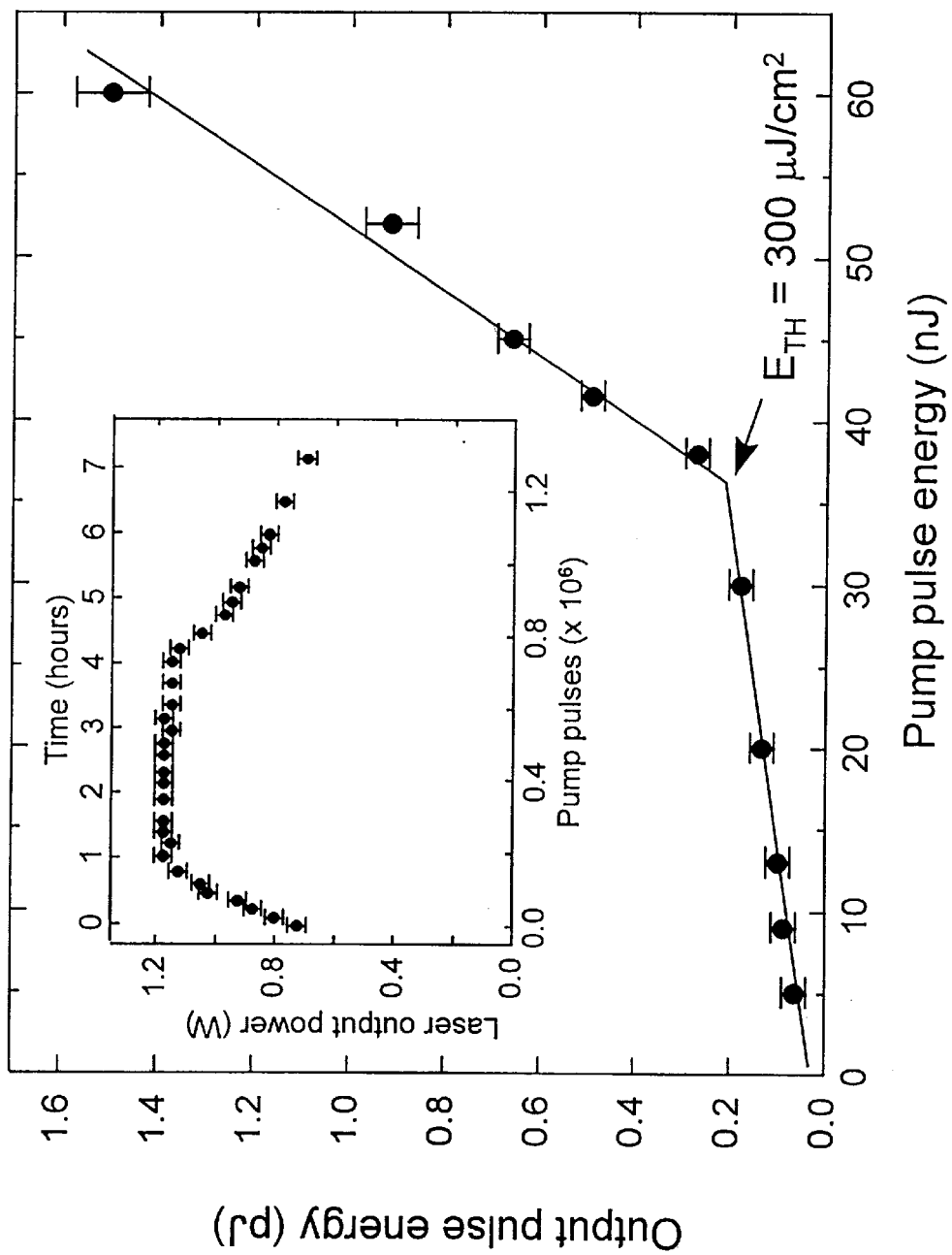
FIG. 12 shows the dependence of output energy on the input pump energy near the lasing threshold for an exemplary embodiment of the OVCSEL of the present invention.

FIG. 12 shows the dependence of the laser output power on input excitation, clearly indicating a threshold at a pump energy density of $E_{TH}$=300 $\mu$J/cm$^2$. This threshold is two orders of magnitude higher than that for similar edge emitting organic semiconductor lasers as a consequence of higher optical losses in the microcavity structure (500 cm$^{-1}$), and a short gain length (500 nm). The Alq$_3$:DCM material gain at threshold in OVCSELs is estimated to be $g_{TH}$=500 cm$^{-1}$, which is comparable to the internal gain in InGaAs/GaAs quantum well structures.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996), for which the Issue Fee was paid on Sep. 23, 1999; "Novel Materials for Multicolor Light Emitting Diodes", Ser. No. 08/850,264 (filed May 2, 1997) for which the Issue Fee was paid on Jan. 21, 2000; "Electron Transporting and Light Emitting Layers Based on Organic Free Radicals", Ser. No. 08/774,120 (filed Dec. 23, 1996), now U.S. Pat. No. 5,811,833; "Multicolor Display Devices", Ser. No. 08/772,333 (filed Dec. 23, 1996), now U.S. Pat. No. 6,013,982; "Red-Emitting Organic Light Emitting Devices (OLED's)", Ser. No. 08/774,087 (filed Dec. 23, 1996), for which the Issue Fee was paid on Jul. 21, 1999; "Driving Circuit For Stacked Organic Light Emitting Devices", Ser. No. 08/792,050 (filed Feb. 3, 1997), now U.S. Pat No. 5,757,139; "High Efficiency Organic Light Emitting Device Structures", Ser. No. 08/772,332 (filed Dec. 23, 1996), now U.S. Pat. No. 5,834,893; "Vacuum Deposited, Non-Polymeric Flexible Organic Light Emitting Devices", Ser. No. 08/789,319 (filed Jan. 23, 1997), now U.S. Pat. No. 5,844,363; "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997), now U.S. Pat. No. 5,917,280; "High Contrast Transparent Organic Light Emitting Device Display", Ser. No. 08/821,380 (filed Mar. 20, 1997), now U.S. Pat. No. 5,986,401; "Organic Light Emitting Devices Containing A Metal Complex of 5-Hydroxy-Quinoxaline as A Host Material", Ser. No. 08/838,099 (filed Apr. 15, 1997), now U.S. Pat. No. 5,861,219; "Light Emitting Devices Having High Brightness", Ser. No. 08/844,353 (filed Apr. 19, 1997), which has been allowed; "Organic Semiconductor Laser", Ser. No. 08/859,468 (filed May 19, 1997); "Saturated Full Color Stacked Organic Light Emitting Devices", Ser. No. 08/858,994 (filed on May 20, 1997), now U.S. Pat. No. 5,932,895; "An Organic Light Emitting Device Containing a Hole Injection Enhancement Layer", Ser. No. 08/865,491 (filed May 29, 1997), now U.S. Pat. No. 5,998,803; "Plasma Treatment of Conductive Layers", PCT/US97/10252, (filed Jun. 12, 1997); "Patterning of Thin Films for the Fabrication of Organic Multi-color Displays", PCT/US97/10289, (filed Jun. 12, 1997); "OLEDs Containing Thermally Stable Asymmetric Charge Carrier Materials", Ser. No. 08/925

029, filed Sep. 8, 1997; "Light Emitting Device with Stack of OLEDS and Phosphor Downconverter", Ser. No. 08/925,403, (filed Sep. 9, 1997), now U.S. Pat. No. 5,874,803; "An Improved Method for Depositing Indium Tin oxide Layers in Organic Light Emitting Devices", Ser. No. 08/928,800 (filed Sep. 12, 1997), now U.S. Pat. No. 5,981,306; "Azlactone-Related Dopants in the Emissive Layer of an Oled" (filed Oct. 9, 1997), for which the issue fee was paid on Jan. 7, 2000, Ser. No. 08/948,130, "A Highly Transparent Organic Light Emitting Device Employing A Non-Metallic Cathode", (filed Nov. 3, 1997), which was a provisional application that has now been converted to regular application Ser. No. 08/964,863, Attorney Docket No. 10020/40 (Provisional), "A Highly Transparent Organic Light Emitting Device Employing a Non-Metallic Cathode", (filed Nov. 5, 1997), Ser. No. 08/964,863, Attorney Docket No. 10020/44, "Low Pressure Vapor Phase Deposition of Organic Thin Films" (filed Nov. 17, 1997), Ser. No. 08/972,156, Attorney Docket No. 10020/37, "Method of Fabricating and Patterning Oleds", (filed Nov. 24, 1997), Ser. No. 08/977,205, Attorney Docket No. 10020/14, "Method for Deposition and Patterning of Organic Thin Film", (filed Nov. 24, 1997), now U.S. Pat. No. 5,953,587, Attorney Docket No. 10020/25 and "OLEDS Doped With Phosphorescent Compounds" (filed Dec. 1, 1997), Ser. No. 08/980,986, Attorney Docket No. 10020/47; each co-pending application being incorporated herein by reference in its entirety. The subject invention may also be used in conjunction with the subject matter of each of co-pending U.S. patent application Ser. Nos. 08/354,674, now U.S. Pat. No. 5,707,745, 08/613,207, now U.S. Pat. No. 5,703,436, 08/632,322, now U.S. Pat. No. 5,757,026, and 08/693,359 and provisional patent application Ser. Nos. 60/010,013, which was converted to a regular U.S. application and is now U.S. Pat. No. 5,986,268, 60/024,001, which was converted to a regular U.S. application and is now U.S. Pat. No. 5,844,363, 60/025,501, which was converted to a regular U.S. application Ser. No. 08/844,353, which has been allowed, 60/046,061 which was converted to a regular U.S. application Ser. No. 08/859,468 and 60/053,176, which was converted to a regular U.S. application Ser. No. 09/010,594, each of which is also incorporated herein by reference in its entirety.

The present invention provides for optical semiconductor lasers with desired properties such as narrow bandwidth emission, the minimal use of active organic materials, and the facilitation of wavelength tuning and electrical pumping. The vertical-cavity surface-emitting structures of the present invention represent the first known successful demonstration of lasing action in a small molecular weight organic semiconductor microcavity structure associated with a clear threshold in the output power, a well defined laser beam, cavity modes, and spectral line narrowing of emission above threshold to less than 1 Å. Those with skill in the art may recognize various modifications to the embodiments of the invention described and illustrated herein. Such modifications are meant to be covered by the spirit and scope of the appended claims.

What is claimed is:

1. A laser comprising:
   a first mirror layer;
   a layer of first active organic material over said first mirror layer; and
   a second mirror layer over said layer of active organic material;
   wherein said first active organic material lases when pumped to thereby produce laser light.

2. The laser of claim 1, wherein said first mirror layer comprises a distributed Bragg reflector dielectric mirror stack.

3. The laser of claim 2, wherein said second mirror layer comprises a distributed Bragg reflector dielectric mirror stack.

4. The laser of claim 2, wherein said second mirror layer is a metal mirror.

5. The laser of claim 1, wherein said first and second mirror layers each reflect at least about 90% of the light produced by said first active organic material.

6. The laser of claim 5, wherein said first and second mirror layers each reflect at least about 95% of the light produced by said first active organic material.

7. The laser of claim 5, wherein said first and second mirror layers reflect different percentages of the light produced by said first active organic material.

8. The laser of claim 1, further comprising a source of optical pump energy for pumping said first active organic material.

9. The laser of claim 8, wherein said optical pump energy comprises a nitrogen laser.

10. The laser of claim 8, wherein:
    said layer of first active organic material varies in thickness; and
    the wavelength of the laser light produced by the pumping of said first active organic material is a function of the thickness of said layer of first active organic material at the location where said optical pump energy pumps said layer of first active organic material.

11. The laser of claim 1, further comprising a first electrode between said first mirror layer and said layer of first active organic material.

12. The laser of claim 11, wherein:
    said second mirror layer functions as an electrode; and
    said first active organic material is electroluminescent such that it is pumped when an electric current is passed between said first electrode and said second mirror layer.

13. The laser of claim 12, wherein said second mirror layer comprises a metal selected from the group consisting of silver and platinum.

14. The laser of claim 11, further comprising:
    a second electrode between said layer of first active organic material and said second mirror layer.

15. The laser of claim 14, wherein:
    said first and second electrodes are substantially transparent;
    at least one of said first and second electrodes comprises indium-tin-oxide; and
    said first active organic material is electroluminescent such that it is pumped when an electric current is passed between said first and second electrodes.

16. The laser of claim 15, wherein both of said first and second electrodes comprise indium-tin-oxide.

17. The laser of claim 15, further comprising a lens between said second electrode and said second mirror layer.

18. The laser of claim 15, further comprising:
    a third mirror layer over said second mirror layer;
    a third electrode over said third mirror layer;
    a second active organic material over said third electrode; and
    a fourth mirror layer over said second active organic material;
    wherein said second active organic material lases when pumped to thereby produce laser light, and wherein the wavelength of the light produced by said first active organic material is different from the wavelength of the light produced by said second active organic material.

19. The laser of claim 18, wherein:

said fourth mirror layer functions as an electrode;

each of said first, second and third electrodes are substantially transparent;

said first and second mirror layers each reflect at least about 95% of the light produced by said first active organic material;

said third and fourth mirror layers each reflect at least about 95% of the light produced by said second active organic material; and said second active organic material is electroluminescent such that it is pumped when an electric current is passed between said third electrode and said fourth mirror layer.

20. The laser of claim 19, wherein each of said first, second and third electrodes comprises indium-tin-oxide.

21. The laser of claim 19, further comprising a fourth electrode between said layer of second active organic material and said fourth mirror layer.

22. The laser of claim 1, wherein said first active organic material comprises a host material doped with a guest material.

23. The laser of claim 22, wherein said host material is selected from the group consisting of $Alq_3$ and CBP.

24. The laser of claim 23, wherein said guest material is selected from the group consisting of DCM, DCM2, rhodamine 6G, perylene, coumarin-47 and coumarin-30.

25. The laser of claim 22, wherein said host material is able to absorb pump energy applied to said layer of first active organic material and to non-radiatively transfer said energy to said guest material.

26. The laser of claim 1, further comprising:

a first guiding layer between said first mirror layer and said layer of first active organic material; and a second guiding layer between said layer of first active organic material and said second mirror layer;

wherein the refractive indices of said first and second guiding layers are greater than the refractive index of said active organic material.

27. The laser of claim 26, further comprising:

a first cladding layer between said first mirror layer and said first guiding layer; and a second cladding layer between said second guiding layer and said second mirror layer; wherein the refractive indices of said first and second cladding layers are less than the refractive indices of said first and second guiding layers, respectively.

28. The laser of claim 1 wherein the laser is incorporated into a communications device.

29. The laser of claim 1, wherein the laser is incorporated into a printer.

30. The laser of claim 1, wherein the laser is incorporated into an etching system.

31. The laser of claim 1, wherein the laser is incorporated into a measuring device.

32. The laser of claim 1, wherein the laser is incorporated into an optical memory device.

33. The laser of claim 1, wherein the laser is incorporated into a display device.

34. The laser of claim 1, wherein the laser is incorporated into a sensor device.

35. A laser comprising:

a transparent substrate;

a first mirror layer over said substrate, said first mirror layer comprising a Bragg reflector dielectric mirror stack;

a layer of active organic material over said first mirror layer;

a buffer layer of organic material over said layer of active organic material;

a second mirror layer over said buffer layer, said second mirror layer comprising a metal mirror; and a source of optical pump energy; wherein said active organic material lases when pumped with said source of optical pump energy to thereby produce laser light; and said first and second mirror layers each reflect at least about 90% of the light produced by said active organic material.

36. A laser comprising:

a transparent substrate, a first mirror layer over said substrate, said first mirror layer comprising a Bragg reflector dielectric mirror stack;

a first electrode over said first mirror layer;

a layer of active organic material over said first electrode;

a second electrode over said layer of active organic material; and a second mirror layer over said second electrode, said second mirror layer comprising a Bragg reflector dielectric mirror stack; wherein said active organic material lases when pumped to thereby produce laser light;

said active organic material is electroluminescent such that it is pumped when an electric current is passed between said first and second electrodes;

said first and second electrodes are substantially transparent; and said first and second mirror layers each reflect at least about 95% of the light produced by said active organic material.

* * * * *